＝United States Patent [19]

Miceli et al.

[11] Patent Number: 4,533,829
[45] Date of Patent: Aug. 6, 1985

[54] OPTICAL ELECTROMAGNETIC RADIATION DETECTOR

[75] Inventors: William J. Miceli, Concord; Jacques E. Ludman, Westford, both of Mass.

[73] Assignee: The United States of America as represented by the Secretary of the Air Force, Washington, D.C.

[21] Appl. No.: 511,592

[22] Filed: Jul. 7, 1983

[51] Int. Cl.³ .............................................. G02B 5/14
[52] U.S. Cl. ................................. 250/227; 356/352; 324/96
[58] Field of Search .......................... 250/231 R, 227; 356/352, 345; 324/96, 95, 72; 455/612

[56] References Cited

U.S. PATENT DOCUMENTS

| 3,679,313 | 7/1972 | Rosenberg | 356/352 |
|---|---|---|---|
| 4,329,580 | 5/1982 | Riley et al. | 324/96 |
| 4,356,448 | 10/1982 | Brogardh et al. | 324/96 |
| 4,360,272 | 11/1982 | Schmadel et al. | 356/352 |
| 4,371,838 | 2/1983 | Griscom | 324/244 |

OTHER PUBLICATIONS

IBM Technical Disclosure, A. W. Lohmann, Fourier-Inverse Dispersion Image Formation for Intensity, vol. 7, No. 7, Dec. 1964, p. 623.
Kersey, A. D. et al., "A Simple Fibre Fabry–Perot Sensor," Optics Communications, vol. 45, No. 2, Mar. 15, 1983, pp. 71–74.
Phelan, Jr., R. J. et al., "Subnanosecond Electrical Modulation of Light with Hydrogenated Amorphous Silicon," Appl. Phys. Lett., 38 (8), Apr. 15, 1981, pp. 596–598.
Kastal'skii, A. A., "Optical and Electrical Effects in Circuits Containing a Fabry–Perot Resonator," Sov. Phys. Semicond., vol. 7, No. 5, Nov. 1973, pp. 635–638.

Primary Examiner—David C. Nelms
Assistant Examiner—J. Jon Brophy
Attorney, Agent, or Firm—Donald J. Singer; Jacob N. Erlich

[57] ABSTRACT

An optical electromagnetic radiation detector having a probe for receiving nearby electromagnetic radiation. The probe includes a loop antenna connected to a pair of transparent electrodes deposited on the end surfaces of an electro-optic Fabry-Perot interferometer. When the loop antenna picks up the presence of electromagnetic radiation, a voltage will be developed across the crystal of the electro-optic Fabry-Perot interferometer thereby changing the optical length of the interferometer. A beam of light from a remote location is transmitted through an optical fiber onto the Fabry-Perot interferometer. The change in optical length of the Fabry-Perot interferometer alters the intensity of the beam of light as it is reflected from the Fabry-Perot interferometer back through the optical fiber to the remote location. A beamsplitter directs this reflected beam of light onto an intensity detector in order to provide an output indicative of the variations in intensity. The variations in intensity are directly related to the strength of the electromagnetic radiation received by the loop antenna.

10 Claims, 2 Drawing Figures

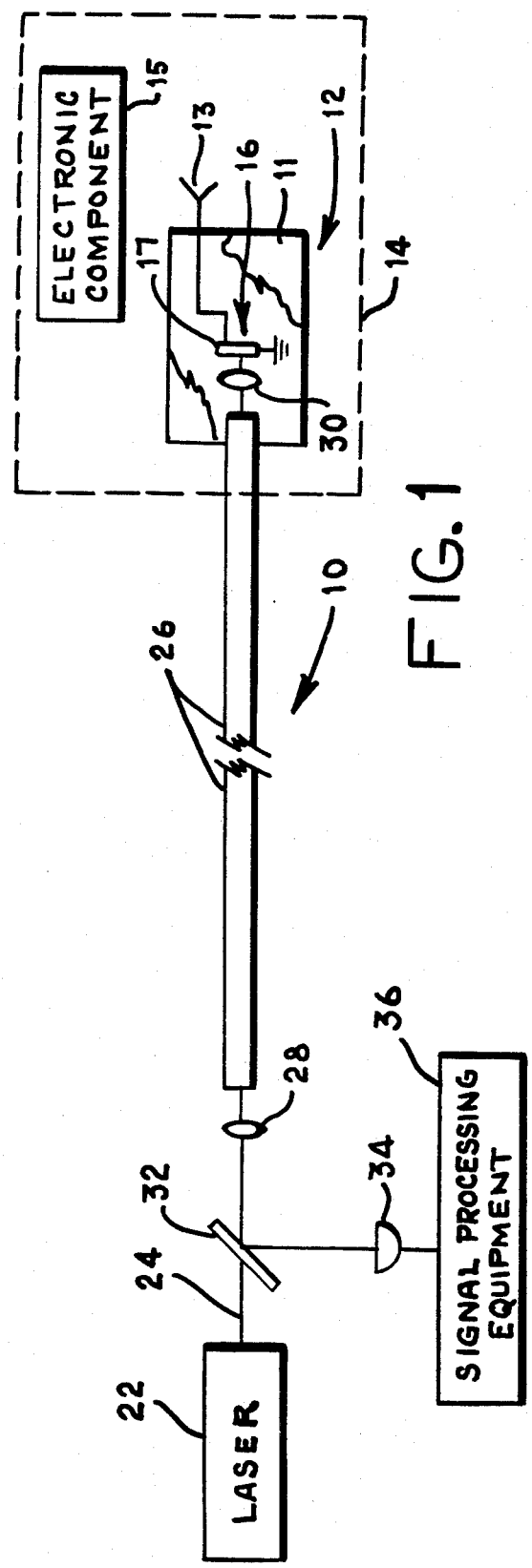
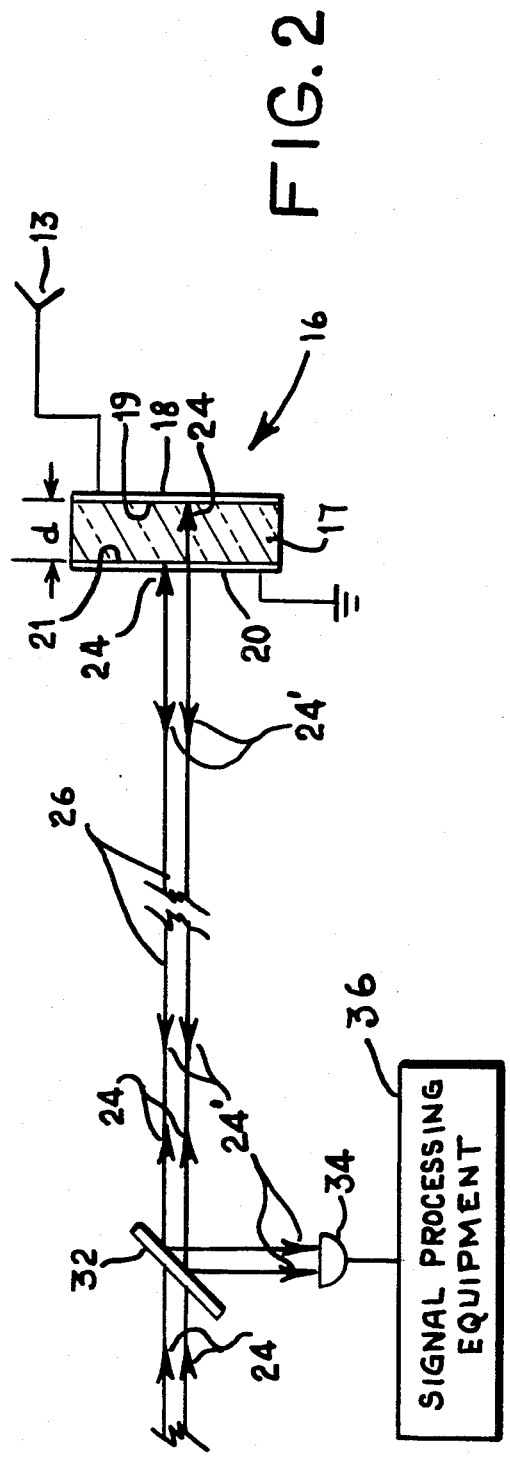

OPTICAL ELECTROMAGNETIC RADIATION DETECTOR

STATEMENT OF GOVERNMENT INTEREST

The invention described herein may be manufactured and used by or for the Government for governmental purposes without the payment of any royalty thereon.

BACKGROUND OF THE INVENTION

This invention relates generally to devices which are capable of detecting sources of electromagnetic radiation or the presence of electromagnetic fields and, more particularly, to an optical device which can be placed in the proximity of a weakly radiating source and which is capable of detecting electromagnetic radiation emanating from the source.

Whenever an electric charge oscillates or is accelerated, a disturbance characterzed by the existence of electric and magnetic fields propagates outward therefrom. Such a disturbance is generally referred to as electromagnetic waves. The range of frequencies of such electromagnetic waves is extremely large, ranging in frequency from approximately $10^{22}$ Hz for gamma rays emanating from radioactive nuclei to 0 Hz in the form of direct current emanating from batteries. In theory, any electromagnetic radiation can be detected by its heating effect. A method incorporating this effect can be used over the range from X-rays to radio waves. Ionization effects measured by cloud chambers, photographic emulsions, ionization chambers, and Geiger counters have been used in the gamma and X-ray regions. Direct photography can be used from the gamma ray to the infrared region. Fluorescence is effective in the X-ray and the ultraviolet ranges while bolometers, thermocouples, and other heat measuring devices are used chiefly in the infrared and microwave regions.

The present invention is primarily concerned with the detection of electromagnetic radiation or electromagnetic fields emanating from such electronic components as printed circuit boards and other individual electronic components such as integrated circuit packages. Heretofore, the detection of such electromagnetic radiation involved the use of detectors which included electrical wires which had to pass through the walls of electrical equipment incorporating such components therein. Unfortunately, the use of electrical conductors such as wires resulted in compromising the integrity of the electrical equipment and therefore such past electromagnetic detectors were less than desirable. In addition, the sensitivity of past detectors was unacceptable in many areas of use. Consequently, it would be extremely desirable to provide a sensitive electromagnetic radiation detector which also eliminated the use of wire connectors in their makeup.

SUMMARY OF THE INVENTION

The present invention overcomes the problems encountered in the past and as set forth in detail hereinabove by providing an optical electromagnetic radiation detector which incorporates therein an electromagnetic detecting probe which can be placed near the field of a weakly radiating source of electromagnetic radiation in order to detect the presence of electromagnetic radiation or fields.

The optical electromagnetic radiation detector of the present invention is a passive device having a probe made up of a conventional solid-state, electro-optic Fabry-Perot interferometer driven by a conventionl small loop antenna. The index of refraction of the crystal forming part of the electro-optic Fabry-Perot interferometer is dependent upon an applied voltage obtained from the small loop antenna. More specifically, the interferometer is made up of a thin slice of a sensitive electro-optic material such as a KDP crystal in which a pair of transparent electrodes are deposited onto the end faces of the crystal in order for the structure to form a resonator whose finesse is determined by surface reflectivity and the optical length of the crystal.

A light beam from a remotely located laser is coupled into an optical fiber and transmitted by the optical fiber to the test site where the light beam is incident upon the electro-optic Fabry-Perot interferometer. Also located at the test site and forming part of the probe is the small loop antenna which is capable of picking up or detecting electromagnetic radiation. The electromagnetic radiation or electromagnetic field picked up by the antenna causes a voltage to be developed across the crystal of the interferometer, thereby altering the optical path length of the interferometer via the electro-optic effect. As a result, the resonant condition of the interferometer is changed thereby also changing the intensity of the light injected back into the optical fiber by the interferometer. Temporal variations in the electromagnetic field or radiation picked up by the antenna will result in identical temporal modulation of the light propagating back through the fiber. The modulated light is retroreflected and recoupled back through the same optical fiber through which it was transmitted for transmission back to the remotely located area adjacent the laser light source.

The reflected light beam, whose intensity is temporally modulated at the frequency of the electromagnetic field and whose magnitude depends upon the strength of the electromagnetic field, is separated from the input light beam by a beamsplitter. This output (reflected) light beam is then detected by a conventional avalanche photodiode. The frequency and magnitude of the detected electromagnetic field are viewed on a conventional RF spectrum analyzer.

It is therefore an object of this invention to provide an optical electromagnetic radiation detector capable of detecting the presence of weak electromagnetic radiation or electromagnetic fields generated at a remote location.

It is another object of this invention to provide an optical electromagnetic radiation detector in which the detector is totally passive, that is, not requiring any biasing voltages or reference light levels.

It is still a further object of this invention to provide an optical electromagnetic radiation detector which incorporates therein the use of a single optical fiber and does not require the presence of electrical wire connectors.

It is an even further object of this invention to provide an optical electromagnetic radiation detector which incorporates therein a detecting probe which is extremely compact in size and is therefore capable of being placed in the proximity of individual electronic components.

It is still a further object of this invention to provide an optical electromagnetic radiation detector in which the light source utilized therewith is spatially separated from the radiation detection area, thereby isolating any interference signals emanating therefrom from the sensitive electronic component detection area.

It is even a further object of this invention to provide an optical electromagnetic radiation detector which is economical to produce and which utilizes conventional, currently available components that lend themselves to standard mass producing manufacturing techniques.

For a better understanding of the present invention, together with other and further objects thereof, reference is made to the following description taken in conjunction with the accompanying drawing and its scope will be pointed out in the appended claims.

DETAILED DESCRIPTION OF THE DRAWING

FIG. 1 is a schematic illustration of the optical electromagnetic radiation detector of this invention; and FIG. 2 is a schematic illustration representative of the optical path travelled by the light beams within the optical electromagnetic radiation detector of the present invention.

DETAILED DESCRIPTION OF THE PREFERRED EMBODIMENT

Reference is now made to FIG. 1 of the drawing which clearly discloses in schematic fashion the optical electromagnetic radiation detector 10 of the present invention. Detector 10 incorporates therein an extremely small, compact electromagnetic radiation detecting probe 12 which can be easily used in the field and adjacent or near a weakly radiating source of electromagnetic radiation. This source of electromagnetic radiation can be in the form of any electrical or electronic equipment 14 (shown in dashed lines in FIG. 1 of the drawing) containing electronic components such as printed circuit 15 therein.

Probe 12 is made up of a housing 11 which contains a small conventional loop antenna 13 partially protruding therethrough and a conventional solid-state, electro-optic Fabry-Perot interferometer 16 more clearly illustrated in FIG. 2 of the drawing. Loop antenna 13 is capable of picking up electromagnetic radiation or electromagnetic fields emanating from the components of electrical equipment 14. The details of the electro-optic Fabry-Perot interferometer 16 are set forth hereinbelow. Consequently, the only part of the electromagnetic radiation detector 10 of this invention which has to be placed within electronic equipment 14 and adjacent the electronic component 15 under test is probe 12.

The electro-optic Fabry-Perot interferometer 16 is made up of a thin slice (approximately 250 microns) of a sensitive electro-optic material such as a KDP crystal 17. As more clearly shown in exaggerated fashion in FIG. 2 of the drawing, transparent electrodes 18 and 20 are deposited on opposite end faces or surfaces 19 and 21 of the crystal 17 of the Fabry-Perot interferometer 16. Antenna 13 is connected to one of the electrodes 18, for example, and the other electrode 20 is connected to ground. This structure, therefore, forms a resonator whose finesse is determined by surface reflectivities of faces 19 and 21 and the optical length or thickness, d, of the crystal 17. When the loop antenna 13 of probe 12 picks the presence of electromagnetic radiation or an electromagnetic field, a voltage will be developed across crystal 17 of electro-optic Fabry-Perot interferometer 16 and the optical path length, d, of the interferometer 16 will be changed via the electro-optic effect in a manner to be set forth in greater detail hereinbelow.

Still referring to FIG. 1 of the drawing, the remaining components which make up detector 10 of the present invention includes any suitable source of monochromatic light such as laser 22. The beam of light 24 which emanates from laser 22 is coupled into an optical fiber 26 by means of any conventional coupling element, such as coupling lens 28, and is directed by means of the optical fiber 26 into the electro-optic Fabry-Perot interferometer 16. Coupling of the light beam 24 into the Fabry-Perot interferometer 16 is also accomplished by any conventional coupling element in the form of coupling lens 30. In this manner, it is possible to situate laser 22 at a remote location with only the probe 12 being located within the electrical equipment 14 under test. In this manner any interference signals generated by laser 22 can be isolated from the vicinity of probe 12 and the electrical components 15 of electrical equipment 14.

As clearly shown in FIG. 2 of the drawing, the light beam by arrowheads 24 (in FIG. 2) which passes through optical fiber 26 onto the Fabry-Perot interferometer 16 is retroreflected (represented by arrowheads 24' in FIG. 2) from the Fabry-Perot interferometer 16 and recoupled back into the optical fiber 26 for transmission back to the remotely located area near the laser light source 22. Interposed between the laser 22 and the coupling lens 28 is a conventional beamsplitter 32 (shown in FIGS. 1 and 2) which is utilized to direct the retroreflected beam of light onto a conventional detector such as an avalanche photodiode 34 and any conventional signal processing equipment 36 which is capable of registering the intensity of the retroreflected beam of light 24' received thereby.

As stated above, when the antenna 13 of probe 12 detects or picks up signals of electromagnetic radiation emanating from the electronic component 15, a voltage is developed across crystal 17 of Fabry-Perot interferometer 16, thereby changing the optical path length, d, of the interferometer 16. This change in optical path length, d, alters the resonant condition of interferometer 16. As a result, the intensity of the light beam 24' retroreflected back into the optical fiber 26 will also change. Thus, temporal variations in the field picked up by antenna 13 of probe 12 will result in identical temporal modulation of a light propagating back through optical fiber 26 and received by detector 34.

Stated more succinctly, and referring once again to FIG. 2 of the drawing, the solid state or electro-optic Fabry-Perot interferometer 16 utilizes an electro-optic crystal 17 whose index of refraction depends upon the applied voltage obtained from antenna 13. The single optical fiber 26 guides an incoming beam of light 24 from the remotely located laser 22 to the Fabry-Perot interferometer 16, which is optically read out in reflection. The reflected light beam 24', whose intensity is temporally modulated at the frequency of electromagnetic field measured, and whose magnitude depends upon the strength of the electromagnetic field, is coupled back into the same optical fiber 26 and separated from the input beam of light 24 by beamsplitter 32. This output or reflected beam of light 24' is then detected by avalanche photodiode 34 and the frequency and magnitude of the detected electromagnetic field are viewed on any conventional signal processing equipment such as conventional RF spectrum analyzer 36.

As stated above, the Fabry-Perot interferometer 16 includes an electro-optic crystal 17 with parallel surfaces 19 and 21. Under a theoretical condition in which the crystal utilized for the Fabry-Perot interferometer 16 is a lossless crystal, when the monochromatic beam of light, such as laser beam 24, passes through the crystal, the intensity ($I_t$) of light transmitted through crystal 17 is defined by the following equation:

$$I_t = I_o \frac{T^2}{(1-R)^2} \left( 1 + \frac{4R}{(1-R)^2} \sin^2\Delta\phi \right)^{-1}$$

where
$I_o$ = Intensity of input (read out) light
R = Reflectivity at surfaces 38 and 40 (equal for both surfaces)
T = Transmission at surfaces 38 and 40 (equal for both surfaces)
$\Delta\phi$ = Change in phase of light as it traverses crystal 17.

It should be noted, however, that in actuality there is no such thing as a lossless crystal and therefore the following equations are provided in order to define the intensity of light ($I_t$) transmitted through the surface of crystal 17 and the intensity of light ($I_r$) reflected from the surfaces of crystal 17 with crystal 17 having low absorption:

$$I_t = I_o \frac{T^2 e^{-2\alpha d}}{(1 - Re^{-2\alpha d})^2} \left( \frac{1 + 4Re^{-2\alpha d}}{(1 - Re^{-2\alpha d})} \sin^2(n'kd) \right)^{-1}$$

where
n = the complex index of refraction of crystal 17, or
$n = n' + in''$ (where n' is the real portion of the index of refraction (n), n'' is the imaginary portion of the index of refraction (n), and i is an integer
α = the absorption coefficient of the electro-optic crystal 17 or
α = n''k
d = the thickness of crystal 17
k = 2π/λ
λ = the wavelength of beam 24.

Similarly, the intensity ($I_r$) of the reflected light is defined as follows:

$$I_r = \frac{I_o(\sqrt{R} - \sqrt{R}(1-A)e^{-2\alpha d})^2 + 4R(1-A)^2 e^{-2\alpha d}\sin^2(n'kd)}{(1 - Re^{-2\alpha d})^2 \left( 1 + \frac{4Re^{-2\alpha d}}{(1 - R3^{-2\alpha d})} \sin^2(n'kd) \right)}$$

Where A = Absorption in crystal 17.

It follows from the above equation that a small change in refractive index (n') has a large effect on the intensity of the reflected light 24'. The refractive index of crystal 17 is a function of the applied electric field across one of its crystalographic axes. This applied field is obtained by the voltage developed by antenna 13 of probe 12. Therefore, it also follows that the intensity of the light 24' reflected by surfaces 19 and 21 of the Fabry-Perot interferometer 16 will have the same temporal dependence as the electromagnetic field detected by the antenna 13 of probe 12. In other words, the modulation frequency of reflected light beam 24' from the Fabry-Perot interferometer 16 is the same as the frequency of the electromagnetic field that is to be detected. Consequently, the present invention is capable of detecting the presence of even weakly radiating electromagnetic fields which may be emanating from any type of electronic component. In fact, with detector 10 of the present invention it is possible to detect electromagnetic radiation of only a few nanovolts. This detection is accomplished passively (that is, without biasing voltages or reference light levels), and with a device in which only a portion (probe 12) of the detecting system 10 is located adjacent the equipment under test.

Although this invention has been described with reference to a particular embodiment, it will be understood that this invention is also capable of further and other embodiments within the spirit and scope of the appended claims.

We claim:

1. An optical electromagnetic radiation detector comprising:
   an electro-optic Fabry-Perot interferometer positioned at a first location, said interferometer being made up of an electro-optic material having a pair of opposed surfaces and a pair of transparent electrodes secured to said electro-optic material;
   means electrically connected to said electrodes for receiving nearby electromagnetic radiation and causing a voltage to be developed across said electro-optic material, said voltage altering the effective length of said electro-optic material thereby changing the resonant condition of said electro-optic Fabry-Perot interferometer;
   means positioned at a second location for providing a monochromatic beam of light;
   means having one end thereof optically aligned with said monochromatic beam of light for transmitting said beam of light out the other end thereof to said Fabry-Perot interferometer, said surfaces of said Fabry-Perot interferometer reflecting said beam of light back into said other end of said transmitting means;
   means adjacent said one end of said transmitting means for receiving said reflected beam of light and directing said reflected beam of light in a predetermined direction away from said light providing means; and
   means optically aligned with said light receiving and directing means for receiving said reflected beam of light therefrom and detecting any variations in the intensity in said reflected beam of light;
   whereby said variations in said intensity of said reflected beam of light is directly related to the strength of said electromagnetic radiation received by said electromagnetic radiation receiving means.

2. An optical electromagnetic radiation detector as defined in claim 1 wherein said electro-optic Fabry-Perot interferometer and said means for receiving said electromagnetic radiation are contained within a housing in order to form a compact probe.

3. An optical electromagnetic radiation detector as defined in claim 2 wherein said means for transmitting said beam of light comprises an optical fiber.

4. An optical electromagnetic radiation detector as defined in claim 3 wherein said probe housing further includes means for coupling said light beam emanating from said other end of said optical fiber into said Fabry-Perot interferometer.

5. An optical electromagnetic radiation detector as defined in claim 4 wherein said means for receiving said nearby electromagnetic radiation comprises a loop antenna.

6. An optical electromagnetic radiation detector as defined in claim 5 wherein said means for providing said beam of light comprises a laser.

7. An optical electromagnetic radiation detector as defined in claim 6 wherein said means for directing said reflected beam of light comprises a beamsplitter.

8. An optical electromagnetic radiation detector as defined in claim 7 wherein said detecting means comprises an avalanche photodiode.

9. An optical electromagnetic radiation detector as defined in claim 1 wherein said means for transmitting said beam of light comprises an optical fiber.

10. An optical electromagnetic radiation detector as defined in claim 9 wherein said means for providing said beam of light comprises a laser.

* * * * *